United States Patent [19]
Morris

[11] 3,964,059
[45] June 15, 1976

[54] METHOD AND APPARATUS FOR STATISTICAL COUNTING

[75] Inventor: Robert Morris, Millington, N.J.

[73] Assignee: Bell Telephone Laboratories, Incorporated, Murray Hill, N.J.

[22] Filed: June 19, 1974

[21] Appl. No.: 480,639

[52] U.S. Cl. .......................... 340/347 DD; 235/154
[51] Int. Cl.² ......................................... H03K 13/00
[58] Field of Search............. 340/347 DD; 235/154, 235/92 MB, 92 CA

[56] References Cited
UNITED STATES PATENTS

| | | | |
|---|---|---|---|
| 3,863,248 | 1/1975 | Deschenes et al. ........... | 340/347 DD |
| 3,866,024 | 2/1975 | Williams......................... | 235/92 CC |

*Primary Examiner*—Kathleen H. Claffy
*Assistant Examiner*—George G. Stellar
*Attorney, Agent, or Firm*—R. O. Nimtz

[57] ABSTRACT

A method and apparatus for counting a large number of events by storing in a register a smaller number statistically related to the large number.

An estimate $v$ is stored representing the actual number of events $n$ according to a logarithmic relationship. The register is updated only if (1) an event occurs to be counted and (2) a random number $r$ obtained from a sample with uniform distribution over the interval 0,1 is less than $$\Delta = (\frac{a}{a+1})^r$$

where $a$ is a numerically derived parameter controlling the size of the event count.

9 Claims, 6 Drawing Figures

METHOD AND APPARATUS FOR STATISTICAL COUNTING

FIELD OF THE INVENTION

This invention relates to methods and apparatus for counting in general, and in particular concerns counting a large number of events by storing in a register a smaller number statistically related to the large number.

BACKGROUND OF THE INVENTION

An n-bit register can ordinarily only be used to count up to $2^n-1$. An 8 bit register can only be used to store counts up to 255 events.

It is often desirable to count a large number of events even though limited register bit storage is available. Small digital computers, for example, are frequently being used in process control where an experiment or process is monitored. Often many counts are performed simultaneously. This necessitates many counters and economy of construction for such computers suggests that the counters be as small as possible.

Prior art methods of counting each event requires that an estimate of the number of events to be counted be made, and counting capacity of each counter provided be made large enough to insure that the counter is never filled. A filled counter would indicate that the number of events exceeded the capacity of the counter and there would be no way to estimate the actual number of events which occurred.

In order to overcome these prior art difficulties the following are objects of this invention:

to provide a counter of $n$ locations which can store a representation of a count of events greater than $2^n-1$, to provide means for estimating the actual number of events from the number stored in the counter.

SUMMARY OF INVENTION

The invention is for a method and apparatus for counting a large number of events by storing in a register a smaller number statistically related to the actual larger number. The small stored number is used as a measure of the actual number, but has a probability of error associated with it depending on the manner in which the representation is made.

A preferred method of the invention is to store in a register an estimate $v$ of the actual number of events $n$ according to a logarithmic relationship. The register is updated when an event occurs to be counted and in addition a random number $r$ obtained from a sample with uniform distribution over the interval 0,1 is less than $$\Delta = (\tfrac{a}{a+1})^v$$

where $a$ is a numerically derived parameter controlling the size of the event count.

An estimate of the actual count is obtained from the number $v$ stored in the register by $$n = a\left[(\tfrac{a+1}{a})^v - 1\right]$$

with an rms error of $$\sigma = \sqrt{\tfrac{n(n-1)}{2a}}$$

DETAILED DESCRIPTION

Theory

An n-bit register can ordinarily be used to count only up to $2^n-1$. Often, the number of events to be counted is very large and the size of registers with which to store counts is small.

If precise counts are not necessary for the particular counting job to be performed, it is possible to store a statistical representation of the actual number and do the counting with limited register storage space.

The most obvious way to count more than $2^n-1$ events in an n-bit register is to count only every other event. This can be accomplished by detecting that an event to be counted has occurred and storing a count in the register only if a flipped coin lands heads. The expected error in estimating the actual number of events from the number stored in the register is small; it can be precisely described. In particular, if the number of events that have occurred is $2n$, the expected value in the counter is $n$ and the rms error is $$\sigma = \sqrt{\tfrac{n}{4}} \qquad (1)$$

so that by the time 400 events have occurred, $\sigma = 5$ and 95 percent of the time the number stored in the register is within 20 of the actual count.

The coin-flipping approach, while appealing, yields unacceptable relative errors for small counts. For example, if one count actually occurs, a 100 percent error is to be expected from the counting process.

A method which overcomes the problem of large relative errors for small counts is to store in the register a number proportional to the logarithm of the actual number of events, making the choice of whether or not to store a count in the register dependent on an independent random experiment. For example, if $v$ represents the number stored in the register, and $n$ represents the actual number of events, define the relationship between $v$ and $n$ as $$v_n = \log_e(1+n). \qquad (2)$$

The quantity $n$ can be recovered from the count $v$ in the register by $$n = e^r - 1. \tag{3}$$

Figure 1:
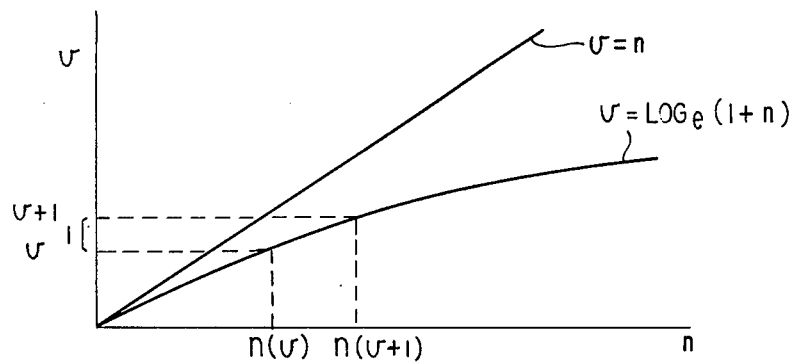
FIG. 1 shows a logarithmic relationship between integral counts $v$ stored in a register and items to be counted $n$.

Whenever an event to be counted is detected, the contents of the register must be updated. Adding 1 to $n$ yields $$n = e^r \tag{4}$$

and $$v_{n+1} = \log_e (1 + e^r). \tag{5}$$

but this is not an integer and a way must be found to decide when to update the storage register. The problem can be demonstrated graphically in FIG. 1. The value of $n$ falls within the incremental increase between $n_{r+1}$ and $n_r$ and the decision of whether or not to update $v$ by 1 must be made.

Following the concept described earlier of deciding whether or not to update depending on the outcome of an independent random process, define the inverse incremental representation $$\Delta = \frac{1}{n_{r+1} - n_r} \tag{6}$$

and update the estimate in the register, i.e., set $$v = v+1 \tag{7}$$

if a random number generator outputs a random number $r$ from a sample uniformly distributed over the interval 0,1 and satisfies the following relation, $$\text{if } \Delta > r \text{ set } v = v+1 \tag{8}$$

$$\text{if } \Delta \leq r \text{ set } v = v.$$

The simple logarithmic function described above has the disadvantage of a large error for small $n$, but this can be overcome through the use of the following relationship, $$v = \frac{\log_e (1 + \frac{n}{a})}{\log_e (1 + \frac{1}{a})} \tag{9}$$

where the parameter $a$ controls both the maximum count that can be stored in the register and the expected error. Equation (6) can now be expressed as $$\Delta = (\frac{a}{a+1})^v \tag{10}$$

The count $n$ is recovered from the inverse of Equation (9) by $$n = a \left| (1 + \frac{1}{a})^v - 1 \right| \tag{11}$$

The expected value of the error in storing a count in a register according to Equations (8) and (9) is $$\sigma = \sqrt{\frac{n(n-1)}{2a}} \tag{12}$$

which shows by inspection zero error for $n = 1$ and small error for small $n$.

The parameter $a$ is a design constant which affects the relationship between the actual number of events $n$ and the stored number $v$ through equation (19) and the statistical error relationship through equation (12). If $a$ is selected to have the value 30, the largest value of $n$, which can be represented by Equation (9) in an 8 bit counter, is approximately 130,000. The rms error $\sigma$ is approximately equal to $n/8$, which implies that the relative error $(n/8)/n$ is nearly independent of $n$.

PHYSICAL EMBODIMENT OF THEORY

Figure 2:
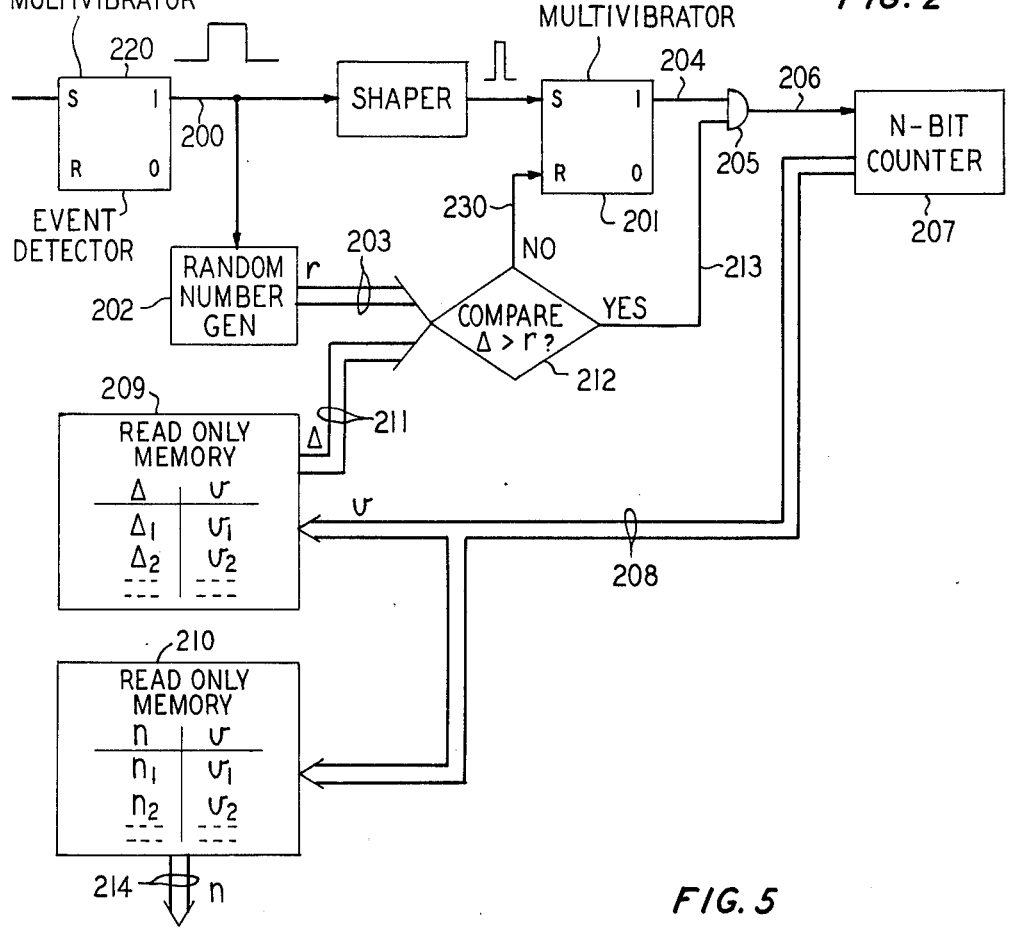
FIG. 2 shows a block diagram of apparatus to store a representation of an actual number of events in an n-bit counter wherein the decision of whether or not to increment the counter is based on a comparison of a randomly generated number, and the number currently stored in the counter.

FIG. 2 shows in block diagram form the electronic circuit embodiment of the theory described above. The event to be counted is detected by an event detector 220, a monostable multivibrator which emits an electrical pulse on line 200. The event to be detected is external to this invention and need only be of sufficient amplitude and length to set an ordinary monostable multivibrator circuit 220.

Line 200 is connected to a monostable multivibrator circuit 201 and a random number generator 202. The line 200 is connected to the "S" input of the monostable multivibrator 201, setting the output to a voltage indicating a "1" output. The line 200 is also connected to the random number generator 202, which triggers it into operation to yield a random number $r$ on lines 203. The monostable multivibrator output line 204 is connected to an AND gate 205 which has two inputs. If enabled by both inputs on lines 204, 213, an enabling voltage on the AND gate output line 206 appears at the input line of the n-bit counter 207.

The output from the n-bit counter is represented by a double line 208 which indicates that $n$ lines, one for each stage of the counter, is applied to read-only memories 209 and 210. The setting of each line of 208 makes up the binary value of $v$ stored in counter 207. Through circuitry explained in detail below, the number $v$ is used as an address for read-only memory 209 to access a location having a value $\Delta$ or $n$ stored therein. The binary representation of $\Delta$ is applied on lines 211 to the comparator 212. Also applied to the comparator 212 are the output lines 203 representing the binary value from the output of the random number generator 202.

The comparator 212 compares $\Delta$ with $r$ and sends a pulse on line 230 to the "R" input of monostable multivibrator 201 if $r \geq \Delta$. If $\Delta > r$, a pulse is sent via line 213 to the other input of AND gate 205, enabling the n-bit counter to be updated via line 206.

Read-only memory 210 is connected to the output bits of the n-bit counter 207 via lines 208. An estimate $n$ corresponding to the value $v$ stored in the counter appears on output lines 214. Each of the circuits of the FIG. 2 block diagram is described in more detail below.

The monostable multivibrator 201 of FIG. 2 is set to the "S" state by a pulse appearing on line 200 for a fixed time only. The duration that the circuit is set to the "S" state is determined by its circuit elements. After the storage period is over, it resets itself to "O". The "R" input of the monostable multivibrator is connected to the "NO" output line 230 of comparator circuit 212. This assures that the monostable multivibrator 201 is set to the "O" stage which removes the enabling voltage from line 204 and readies the circuit for another pulse on line 200.

Figure 3:
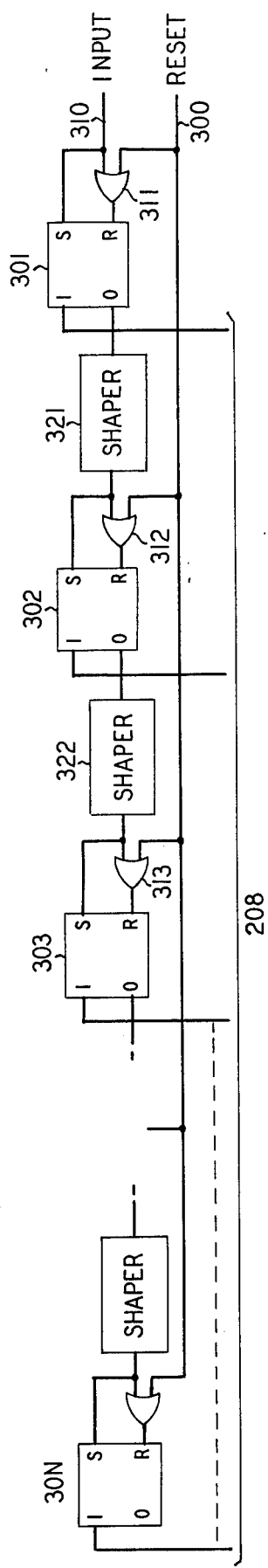
FIG. 3 shows details of an n-bit counter.

The n-bit counter 207 of FIG. 2 is shown in more detail in FIG. 3. Each of the bit storage units 301, 302, 303, . . . is a device capable of being set to a "O" or "1" such as an ordinary flip-flop.

Before use, each bit storage of the counter is cleared (set to R) by a pulse applied to the reset lines 300. The first input pulse on line 310 to be stored or counted is applied to the "S" input and to the "R" input of bit storage unit 301 through OR gate 311. Bit storage unit 301 is thus used as a trigger. Bit storage unit 301 is set by this pulse to what it is not; since it was just reset, it is now "O" and hence it is set to "1" by the first pulse. The second pulse sets bit storage unit 301 back to "O"; in so doing, the shaper circuit 321 emits a pulse; this pulse is applied to both the "S" input and "R" input of bit storage unit 302 through OR gate 312. Bit storage unit 302 is set to what it is not and hence is set to "1". The next input pulse sets bit storage unit 301 to "1". The next input pulse sets bit storage unit 301 to "O"; this enters a pulse into bit storage unit 302, this in turn enters a pulse into the third bit storage unit 303 setting it to 1. Successive pulses cause the bit storage to assume states corresponding to successive binary numbers. Lines from each "1" state of bit storage units are collectively labeled 208 in FIG. 3 and as shown in FIG. 2, are applied to read-only memory 209.

Figure 4:
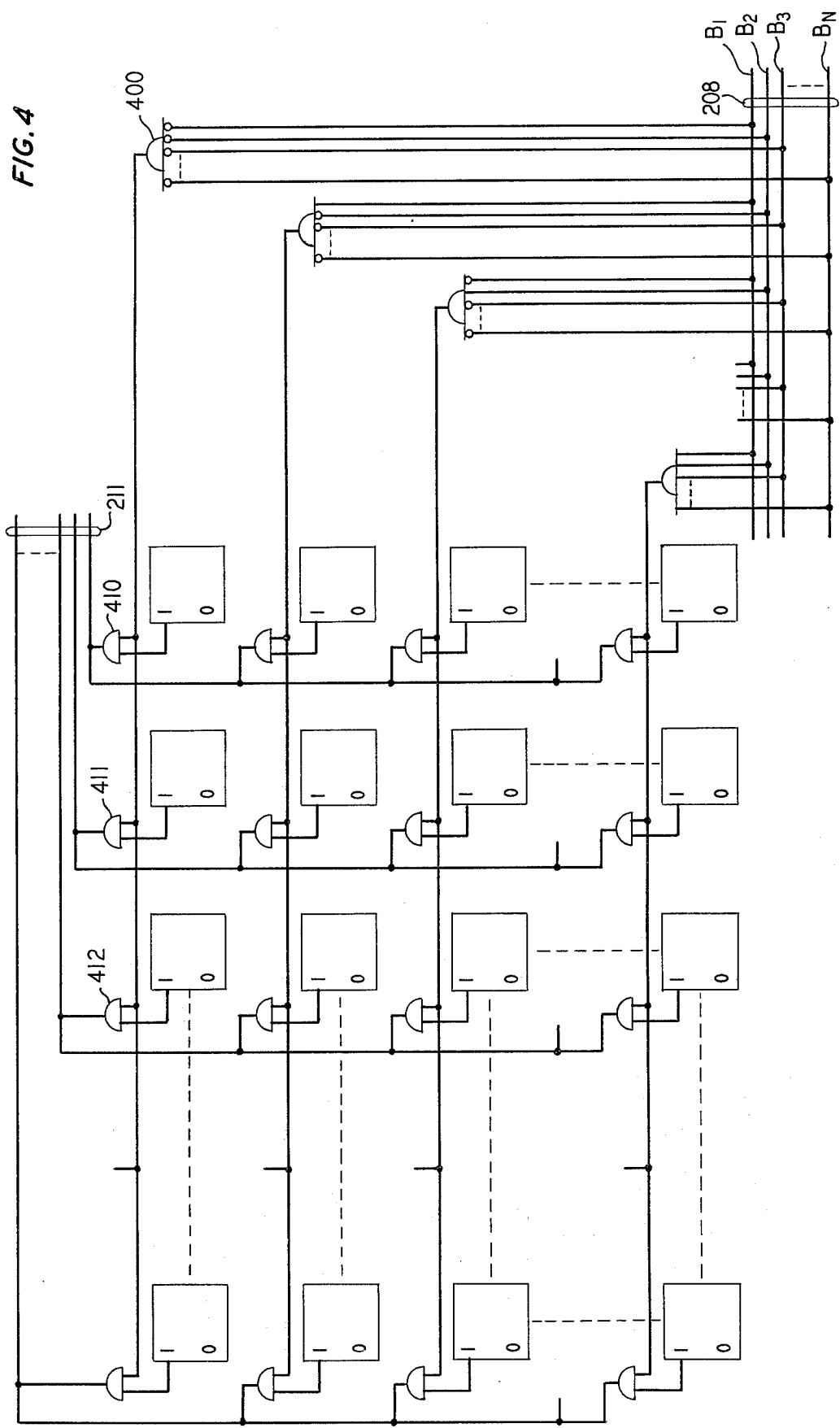
FIG. 4 shows details of a read-only memory.

FIG. 4 shows details of read-only memories 209, 210 of FIG. 3. Bit storage units, such as flip-flops, are provided for each value $v$ stored in the n-bit counter. If the bit counter contains 8 bit storage units, then $v$ can take on $2^8-1$ different values, or 255. Thus the number of rows of bit storage units would be 255 rather than the 3 shown for illustrative purposes in FIG. 4. Each row is set with a unique value of $\Delta$ of m-bit storage units corresponding to a unique value of $v$ through the relationship of Equation (6). Read-only memory 210 of FIG. 2 is identically constructed with bit storage rows stored with binary representations of $n$ corresponding to values of $v$ through Equation (10).

The read-only memory shown in FIG. 4 will yield the contents of the first row of bit storage units onto lines 211 if each of the bits on lines 208 is set to the "O" state. NAND gate 400 produces an output only if each of its inputs is in the "O" state. The output from gate 400 enables each of the bit storage units through AND gates connected to the "1" stage for each unit. AND gates 410, 411, 412, . . . are examples of gates enabled from the output of NAND gate 400. NAND logic is provided for each of the possible binary bit combinations, to enable output from the corresponding row of bit storage units in the read-only memory.

Output lines 214 for the read-only memory 210 of FIG. 2 are equivalent to output lines 211 in FIG. 4.

Figure 5:
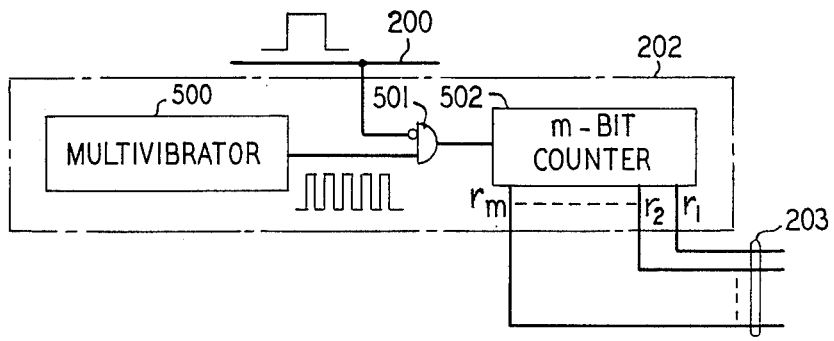
FIG. 5 shows details of a random number generator.

FIG. 5 shows a random number generator suitable for this application. The multivibrator 500 is constructed such that its square wave output is at a frequency much higher than the occurrence of pulses to be counted appearing on line 200. As long as no pulses to be counted are present, the NAND gate passes the multivibrator output to the input of the m-bit counter 502. This counter is of the same construction as the n-bit counter shown in FIG. 3, but of course has but m-bit storage units. The number $m$ bits are needed to correspond to the $m$ bits used to represent $\Delta$ values in read-only memory 209 shown in FIGS. 2 and 4.

When a pulse to be counted occurs, the m-bit counter 502 stops receiving inputs and the value of the bits $r_m$ . . . $r_2$, $r_1$, shown on lines 203, are essentially random numbers over the m-bits. The counter 502 of course starts counting over once the counter is full. The high frequency of the multivibrator output in comparison to the frequency of occurrence of pulses to be counted (e.g., 100 to 1) assures sufficient uniform randomness for the purpose of this invention.

Figure 6:
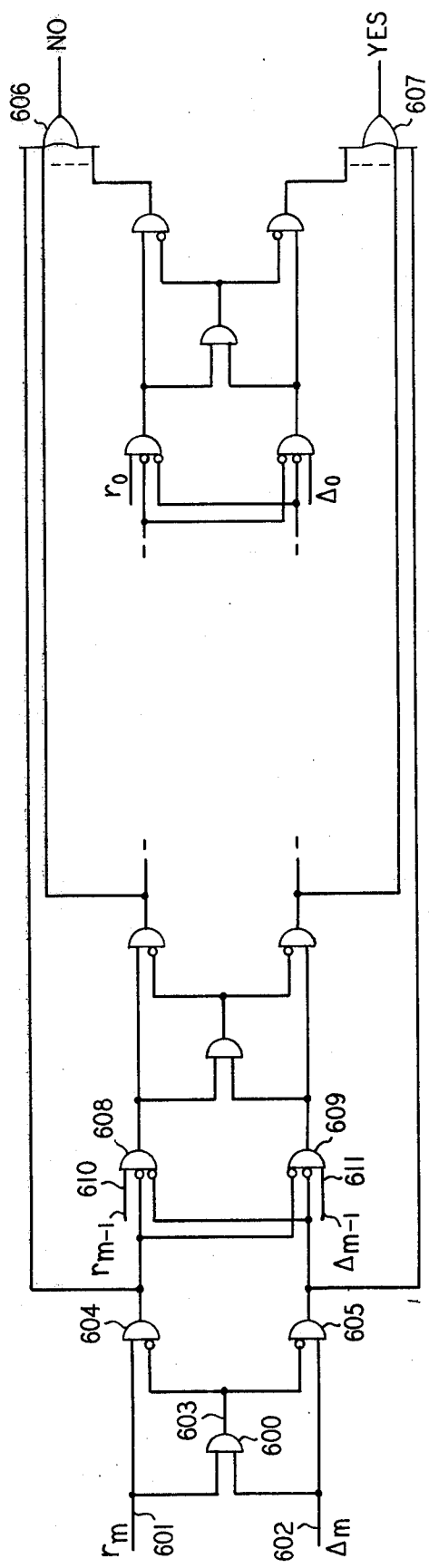
FIG. 6 shows details of a parallel comparison circuit for comparing two binary numbers each of $m$ bits.

FIG. 6 shows details of comparison circuit shown in block diagram 212 in FIG. 2. The comparison circuit assumes the most significant bit of both $r$ and $\Delta$ is at the left. Hence, the corresponding bits, starting from the left, are compared in turn to test if $\Delta > r$. AND gate 600 is input with lines 601, 602 corresponding to the most significant bits of $r$ and $\Delta$. If both $r_m$ and $\Delta_m$ are in the "1" state, then line 603 is also in the "1" state. Gates 604 and 605 are not open since the inputs from line 603 are inhibited when line 603 is in the "1" state. Thus the most significant bits do not send a pulse to either the "NO" OR gate 606 or the "YES" OR gate 607. The same is true if both $r_m$ and $\Delta_m$ are "O" on lines 601 and 602. In this instance, line 603 is in the "O" state, but gates 604 and 605 are not open since their inputs from lines 601 and 602 are "O". If $\Delta_m$ is in the "1" state while $r_m$ is in the "O" state, line 603 is in the "O" state, line 602 is in the "1" state and gate 605 transmits a "1" to the gate 607 which indicates that $\Delta > r$. The converse is true if $r_m$ is in the "1" state while $\Delta_m$ is in the "O" state; gate 604 is open and transmits a "1" to gate 606 indicating that $\Delta < r$.

If either gate 604 or 605 is in the "1" state, the next most significant bits $r_{m-1}$ and $\Delta_{m-1}$ are not compared since NAND gates 608 and 609 inhibit lines 610 and 611. Each successive stage tests corresponding bits in the same manner as described above.

It is apparent that there has been provided in accordance with the invention a novel method and apparatus which fully satisfy the objects, aims and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications and variations as fall within the spirit and scope of the appended claims.

What is claimed is:

1. A method for recording the count of electrical pulse signals comprising the steps of:
    detecting that an electrical pulse has occurred,
    generating a sequence of random numbers,
    storing a count bearing a desired relation to the number of the detected pulses,
    generating a comparison number having a preselected relation to said count,
    for each detected pulse, comparing one of said random numbers with said comparison number, and
    selectively incrementing the value of said count depending on the outcome of said comparison.

2. Apparatus for recording the count of electrical pulse signals comprising:
    means for detecting the occurrence of an electrical pulse;
    means for generating a sequence of random numbers,
    means for storing a count bearing a desired relation to the number of detected pulses,
    means for generating a comparison number bearing a preselected relation to said stored count,
    means for comparing one of said random numbers and said comparison number, and means for incrementing the value of said stored count depending on the outcome of said comparison.

3. A statistical counting method for recording a count bearing a preselected relationship to an estimate of the actual number of countable events comprising the steps of
  1. generating a signal representing the incremental increase in said estimate for each incremental increase in said count,
  2. generating a random signal,
  3. comparing said random signal with the inverse of said incremental representation,
  4. producing a comparator output signal when said inverse exceeds said random signal,
  5. storing a count to be advanced, and
  6. advancing said count for each countable event corresponding with said comparator output signal.

4. A statistical counter for recording a count bearing a preselected relationship to an estimate of the actual number of countable events comprising
  a signal generator for generating a signal representing the incremental increase in said estimate for each incremental increase in said count,
  a counter,
  a random signal generator,
  a comparator for producing an output signal when the inverse of said incremental representation exceeds the random signal, and
  means for advancing said counter for each countable event and concurrent comparator output signal from said comparator.

5. A method of statistically representing a number of countable events comprising the steps of
  detecting said countable events,
  generating signals statistically representing said countable events,
  generating random number signals,
  comparing the difference between said statistical representation signals and a random number signals, and
  incrementing said statistical representation signal when said difference signal exceeds said random number signal.

6. A method of recording a count statistically related to the actual count of events comprising the steps of
  detecting the event signals as they occur,
  for each detected event signal, generating a random number signal,
  recording count signals statistically related to said event signals,
  for each recorded count signal, generating a number signal related to the previously recorded count signal by a preselected relationship,
  comparing said random number signal and said generated number signal, and
  in response to said comparison, selectively incrementing said previously recorded count signal.

7. A method for recording the count of electrical pulse signals comprising the steps of:
  detecting that an electrical pulse has occurred,
  generating a signal proportional to an independent random number,
  recording a count having a logarithmic relation to the number of said detected pulses,
  generating a signal proportional to the logarithmic representation of said count,
  comparing the random number signal with the proportional signal, and
  incrementing the recorded count based on the comparison.

8. The method of claim 7 wherein said signal proportional to a logarithmic representation of the count of said electrical pulse signals is of the form $$\Delta = \frac{1}{n(v+1) - n(v)}$$

where $\Delta$ represents the proportional signal, and $n_v$ represents the value of $n$, the actual number of detected electrical pulses evaluated at $v$ the recorded number of pulses.

9. Apparatus for recording the count of electrical pulse signals comprising:
  means for detecting the occurrence of an electrical pulse;
  a random number generator responsive to the detecting means for generating a random number $r$ on the occurrence of an electrical pulse;
  an n-bit counter for storing a binary number $v$ logarithmically proportional to the number of pulses $n$ detected by the detecting means;
  a memory circuit for storing corresponding values of $\Delta$ and $v$ where $\Delta$ is defined as $$\Delta = \frac{1}{n(v+1) - n(v)}$$

a comparison circuit to compare the number $\Delta$ stored in said memory circuit corresponding to the value $v$ stored in said n-bit counter with the number $r$ generated from said random number generator;
  means for updating the counter by 1 if said number $\Delta$ is greater than said number $r$.

* * * * *